(12) United States Patent
Latypov et al.

(10) Patent No.: US 7,713,667 B2
(45) Date of Patent: May 11, 2010

(54) SYSTEM AND METHOD FOR GENERATING PATTERN DATA USED TO CONTROL A PATTERN GENERATOR

(75) Inventors: Azat M. Latypov, Danbury, CT (US); Arno Jan Bleeker, Westerhoven (NL); Jang Fung Chen, Cupertino, CA (US); Kars Zeger Troost, Waalre (NL)

(73) Assignee: ASML Holding N.V., Veldhoven (NL)

( * ) Notice: Subject to any disclaimer, the term of this patent is extended or adjusted under 35 U.S.C. 154(b) by 1193 days.

(21) Appl. No.: 10/998,991

(22) Filed: Nov. 30, 2004

(65) Prior Publication Data

US 2006/0115752 A1 Jun. 1, 2006

(51) Int. Cl.
G03F 9/00 (2006.01)
(52) U.S. Cl. .............................. 430/30; 430/5; 716/19; 716/21
(58) Field of Classification Search ..................... 430/5, 430/30; 716/19, 20, 21
See application file for complete search history.

(56) References Cited

U.S. PATENT DOCUMENTS

| | | | |
|---|---|---|---|
| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,687,041 | B1 | 2/2004 | Sandstrom |
| 6,747,783 | B1 | 6/2004 | Sandstrom |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 6,928,636 | B2 | 8/2005 | Ohnuma |
| 6,952,818 | B2 | 10/2005 | Ikeuchi |
| 7,500,218 | B2 * | 3/2009 | Troost et al. .................. 716/21 |
| 2002/0102479 | A1 | 8/2002 | Cutter et al. |
| 2002/0152452 | A1 | 10/2002 | Socha |
| 2004/0023132 | A1 | 2/2004 | Akiyama |
| 2004/0041104 | A1 | 3/2004 | Liebregts et al. |
| 2004/0130561 | A1 | 7/2004 | Jain |
| 2005/0007572 | A1 | 1/2005 | George et al. |
| 2006/0040187 | A1 * | 2/2006 | Troost et al. .................. 430/5 |

FOREIGN PATENT DOCUMENTS

| | | | |
|---|---|---|---|
| DE | 199 14 583 A1 | 10/2000 | |
| EP | 1 235 103 A2 | 8/2002 | |
| EP | 1 329 771 A2 | 7/2003 | |
| EP | 1 424 596 A2 | 6/2004 | |
| EP | 1 454 194 | 9/2004 | |
| EP | 1 628 157 A1 | 2/2006 | |
| JP | 11-3849 A | 1/1999 | |
| JP | 2001-281836 A | 10/2001 | |
| JP | 2002-333700 A | 11/2002 | |
| JP | 2002-351051 A | 12/2002 | |
| JP | 2003-162041 A | 6/2003 | |
| JP | 2003-215780 A | 7/2003 | |
| JP | 2004-012722 A | 1/2004 | |
| KR | 2002-0070130 A | 9/2002 | |
| WO | WO 98/33096 | 7/1998 | |
| WO | WO 98/38597 | 9/1998 | |
| WO | WO 99/27420 A1 | 6/1999 | |
| WO | WO 03/023488 A1 | 3/2003 | |
| WO | WO 03/052516 A1 | 6/2003 | |
| WO | WO 2004/032000 A1 | 4/2004 | |

(Continued)

OTHER PUBLICATIONS

Troost et al., U.S. Appl. No. 10/919,532, filed Aug. 17, 2004, entitled "Lithographic Apparatus, Method and Computer Program Product for Generating a Mask Pattern and Device Manufacturing Method Using Same".
Translation of Office Action for Japanese Patent Application No. 2005-346834 mailed November 18, 2008, 2 pgs.
English translation of Korean Office Action, dated Oct. 16, 2006, for KR Patent Application No. 10-2005-0075272, 9 pages.
European Search Report for Appln. No. 05254979.7-2222, mailed Nov. 25, 2005, 7 pages.
Office Action, dated Jun. 14, 2007, for European Application No. 05 254 979.7-1226, 5 pgs.

(Continued)

*Primary Examiner*—Christopher G Young
(74) *Attorney, Agent, or Firm*—Sterne, Kessler, Goldstein & Fox P.L.L.C.

(57) ABSTRACT

A method and system are used to modify pattern data obtained in relation to a pattern on a static patterning device. It is suggested that, in an example when a maskless lithography tool is used, continuous OPC-enhanced features used for maskless lithography rasterization should include a variation in local amplitude and phase transmittance that matches modulation capabilities of a patterning device being used. The modified pattern data is used by a dynamic patterning device to pattern impinging light, which is then projected onto an object. The system and method comprise using a pattern data generating device, a modification device, a dynamic pattern generator, and a projection system. The pattern data generating device generates pattern data corresponding to a pattern on a static patterning device. The modification device receives the pattern data and modifies the pattern data using characteristics of a type of the dynamic pattern generator being used. The dynamic pattern generator receives the modified patterned data and uses the modified pattern data to pattern the beam of radiation. The projection system projects the patterned beam onto the object.

16 Claims, 7 Drawing Sheets

OTHER PUBLICATIONS

Examination for European Application No. 05 254 979.7-1226 mailed Feb. 13, 2008, 5 pgs.

Schneider et al., "Compensation of long-range process effects on photomasks by design data correction", SPIE vol. 4889, 2002, pp. 59-66.

Soon Ho Kim, "Mask process proximity correction for next-generation mask fabrication", J. Vac. Sci. Technol. B 21(6), 2003, pp. 3041-3045.

Pati et al., "Exploiting Structure in Fast Aerial Image Computation for Integrated Circuit Patterns", IEEE Transactions on Semiconductor manufacturing, vol. 10, Nr. 1, 1997, pp. 62-74, XP2256517.

Translation of Office Action for Japanese Patent Application No. 2005-235896 mailed Nov. 18, 2008, 3 pgs.

English abstract for Japanese Publication No. JP 2003-521720T published Jul. 15, 2003, 1 pg.

English abstract for Japanese Publication No. JP 2001-281836 A published Oct. 10, 2001, 1 pg.

English abstract for German Publication No. DE 199 14 583 A1 published Oct. 5, 2000, 1 pg.

Non-Final Rejection mailed Feb. 21, 2008 for U.S. Appl. No. 10/919,532, 8 pgs.

Final Rejection mailed Sep. 4, 2008 for U.S. Appl. No. 10/919,532, 5 pgs.

Notice of Allowance mailed Nov. 21, 2008 for U.S. Appl. No. 10/919,532, 4 pgs.

Supplemental Notice of Allowance mailed Nov. 21, 2008 for U.S. Appl. No. 10/919,532, 4 pgs.

Supplemental Notice of Allowance mailed Jan. 16, 2009 for U.S. Appl. No. 10/919,532, 2 pgs.

* cited by examiner

SYSTEM AND METHOD FOR GENERATING PATTERN DATA USED TO CONTROL A PATTERN GENERATOR

BACKGROUND

1. Field of the Invention

The present invention relates to a light patterning device and method of using same.

2. Related Art

A patterning device is used to pattern incoming light. A static patterning device can include reticles or masks. A dynamic patterning device can include an array of individually controllable elements that generate a pattern through receipt of analog or digital signals. The algorithm used to control the dynamic patterning device, so that its individually controllable elements are in a proper state to form a desired pattern, is called a rasterization algorithm or optical rasterization algorithm. Example environments for use of the patterning device can be, but are not limited to, a lithographic apparatus, a projector, a projection display apparatus, or the like.

Pattern information for the dynamic pattern generator is generated from the pattern data of the static patterning device, for instance a mask used in optical lithography. Thus, it includes all manufacturing constraints that must be taken into consideration when forming the static patterning device, as well as manufacturing constraints that must be taken into consideration when using the static patterning device for exposing a pattern on an object. In one example, capturing the pattern data of the static patterning device is done through aerial imaging of a static patterning device pattern to form pattern data, which is run through an algorithm to generate pattern data to be used by the dynamic pattern generating device. In another example, data that was used to form a pattern on the static patterning device is used to control a pattern formed by the dynamic pattern generator.

However, the dynamic pattern generator behaves differently than the static patterning device, and is not inhibited by the same constraints as the static patterning device. Further, the various types of dynamic patterning devices have different operational characteristics, which are not taken into account when using the pattern data from the static pattering device to control the dynamic patterning device. All this can lead to a reduction in effectiveness of the dynamic patterning device to form desired patterns on the object.

Therefore, what is needed is a system and method that are used to generate pattern data used by a dynamic patterning device, such that the pattern data is not constrained by parameters that are necessary in a static patterning device environment, but are unnecessary in a dynamic pattern device environment, possibly while taking into consideration a type of dynamic patterning device being used.

SUMMARY

According to one embodiment of the present invention, there is provided a system and method that both removes from pattern data any information regarding manufacturing constraints of a static patterning device and adds to the pattern data specific characteristics regarding an actual spatial light modulator being used to pattern a beam of radiation.

In one example, the pattern data is OPC-enhanced pattern data that includes variations in local amplitude and phase transmittance, which matches the modulation capabilities of the spatial light modulator being used.

According to one embodiment of the present invention, there is provided a method comprising the following steps. Generating a pattern data set based on a reticle pattern. Modifying the pattern data set using parameters corresponding to a type of dynamic pattern generator being used to pattern a beam of radiation. Producing a pattern with the dynamic pattern generator using the modified pattern data set. Patterning the beam of radiation with the dynamic pattern generator having the pattern. Projecting the patterned beam onto a target portion of an object.

Another embodiment of the present invention provides a system comprising a pattern data generating device, a modification device, a dynamic pattern generator, and a projection system. The pattern data generating device generates pattern data corresponding to a reticle pattern. The modification device receives the pattern data and modifies the pattern data using characteristics of a type of dynamic pattern generator used to pattern a beam of radiation. The dynamic pattern generator receives the modified patterned data and uses the modified pattern data to pattern the beam of radiation. The projection system projects the pattered beam onto an object.

In a further embodiment, the present invention provides a computer program product comprising a computer useable medium having a computer program logic recorded thereon for controlling at least one processor, the computer program logic comprising computer program code devices that perform operations similar to the devices in the above embodiment.

Further embodiments, features, and advantages of the present inventions, as well as the structure and operation of the various embodiments of the present invention, are described in detail below with reference to the accompanying drawings.

It is to be appreciated that the Summary sets for one or more exemplary embodiments and/or examples, but not all embodiments and/or examples, of the present invention, and thus should not be seen to be limiting the present invention, or the appended claims, in any way.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION OF THE EMBODIMENTS

Overview

Figure 1:
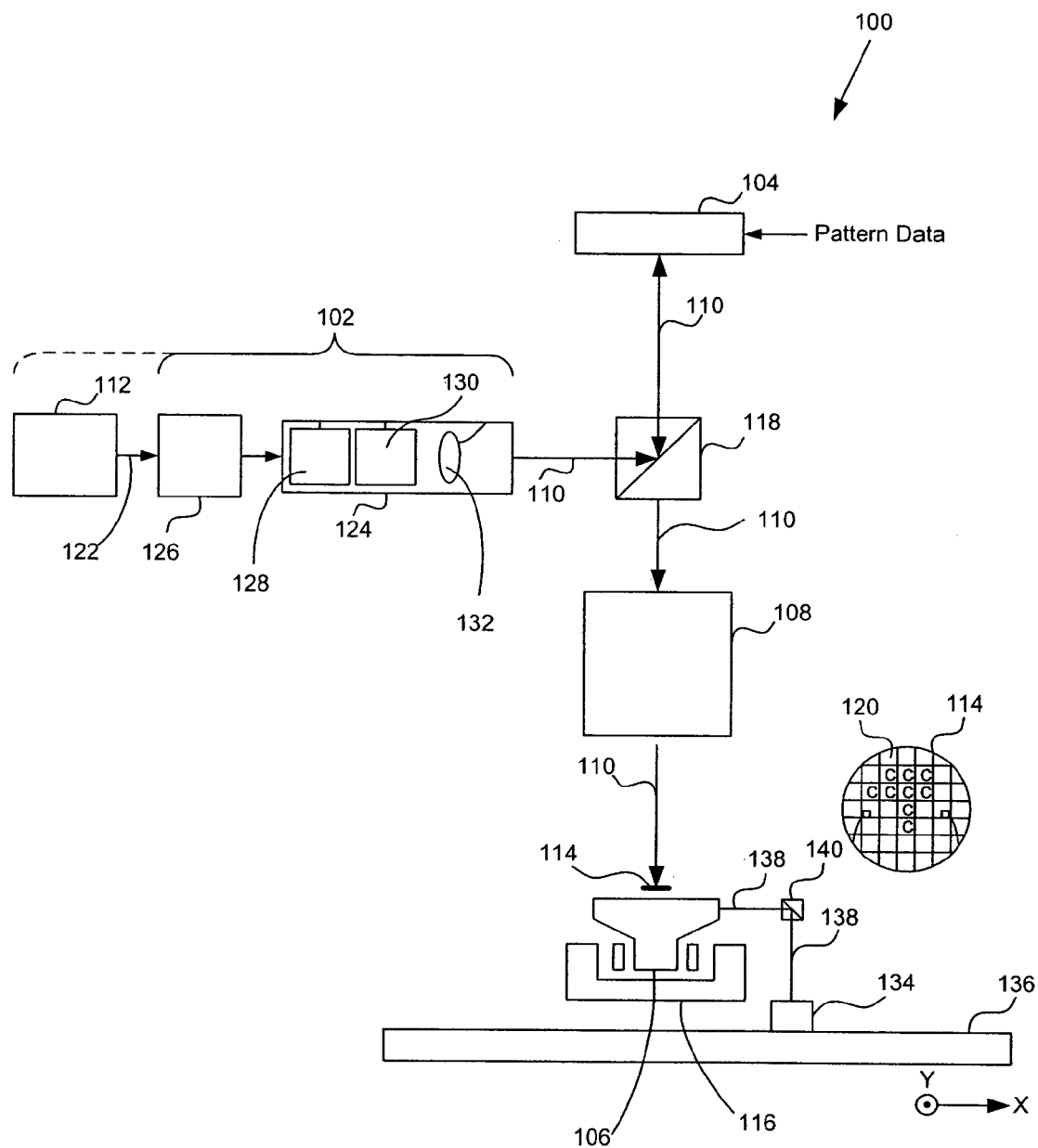
FIG. 1 depicts a lithographic apparatus, according to one embodiment of the invention.

Although specific reference may be made in this text to the use of a patterning device in a lithographic system that patterns a substrate, it should be understood that the patterning device described herein may have other applications, such as in a projector or a projection system to pattern an object or display device (e.g., in a projection television system, or the like). Therefore, the use of the lithographic system and/or substrate throughout this description is only to describe one embodiment of the present invention.

According to one or more embodiments, a method and system are used to modify pattern data obtained in relation to a pattern on a static patterning device. The modified pattern data is used by a dynamic patterning device to pattern impinging light, which is then projected onto an object. The system and method comprise using a pattern data generating device, a modification device, a dynamic pattern generator, and a projection system. The pattern data generating device generates pattern data corresponding to a pattern on a static patterning device. The modification device receives the pattern data and modifies the pattern data using characteristics of a type of the dynamic pattern generator being used. The dynamic pattern generator receives the modified patterned data and uses the modified pattern data to pattern the beam of radiation. The projection system projects the patterned beam onto the object.

The modified pattern data can take into account constraints placed on a static patterning device, which are not needed when using a dynamic patterning device, as well as optical characteristics about a system including the dynamic patterning device and/or the type of dynamic patterning device being used (e.g., DMD, LCD, etc. and/or phase shifting, alternative phase shifting, attenuating phase shifting, etc.). In one example, this modification of static patterning device data into dynamic patterning device data can be done in real time, talking into account one or more of these factors.

Terminology

Although specific reference may be made in this text to the use of a lithographic apparatus in the manufacture of ICs, it should be understood that the lithographic apparatus described herein may have other applications, such as, for example, the manufacture of DNA chips, micro-electro-mechanical systems (MEMS), micro-optical-electro-mechanical systems (MOEMS), integrated optical systems, guidance and detection patterns for magnetic domain memories, flat panel displays, thin film magnetic heads, micro and macro fluidic devices, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed above and below.

A programmable mirror array may comprise a matrix-addressable surface having a viscoelastic (i.e., a surface having appreciable and conjoint viscous and elastic properties) control layer and a reflective surface. The basic principle behind such an apparatus is that, for example, addressed areas of the reflective surface reflect incident light as diffracted light, whereas unaddressed areas reflect incident light as undiffracted light. The addressing can be binary or through multiple intermittent angles. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light. This is sometimes referred to as a grating light valve.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In one example, groups of the mirrors can be coordinated together to be addresses as a single "pixel." In this example, an optical element in an illumination system can form beams of light, such that each beam falls on a respective group of mirrors.

In both of the situations described here above, the array of individually controllable elements can comprise one or more programmable mirror arrays.

A programmable LCD array can also be used.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

In the lithography environment, the term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the substrate and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Exemplary Environment for a Patterning Device

Although the patterning device of the present invention can be used in many different environments, as discussed above, a lithographic environment will be used in the description below. This is for illustrative purposes only.

A lithographic apparatus is a machine that applies a desired pattern onto a target portion of an object. The lithographic apparatus can be used, for example, to pattern an object in a biotechnology environment, in the manufacture of ICs, flat panel displays, micro or nano fluidic devices, and other devices involving fine structures. In a an IC-based lithographic environment, the patterning device is used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). As discussed above, instead of a mask, in maskless IC lithography the patterning device may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction. These concepts will be discussed in more detail below.

FIG. 1 schematically depicts a lithographic projection apparatus 100, according to one embodiment of the invention. Apparatus 100 includes at least a radiation system 102, a patterning device 104 (e.g., a static device or an array of individually controllable elements) that receives pattern data, an object table 106 (e.g., a substrate table), and a projection system ("lens") 108.

Radiation system 102 is used to supply a beam 110 of radiation, which in this example also comprises a radiation source 112.

Array of individually controllable elements 104 (e.g., a programmable mirror array) is used to pattern beam 110 through patterns formed from receipt of pattern data. In one example, the position of the array of individually controllable elements 104 is fixed relative to projection system 108. However, in another example, array of individually controllable elements 104 is connected to a positioning device (not shown) that positions it with respect to projection system 108. In the example shown, each element in the array of individually controllable elements 104 are of a reflective type (e.g., have a reflective array of individually controllable elements).

Object table 106 is provided with an object holder (not specifically shown) for holding an object 114 (e.g., a resist coated silicon wafer, a glass substrate, or the like). In one example, substrate table 106 is connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) is used to project the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser, or the like) produces a beam of radiation 122. Beam 122 is fed into an illumination system (illuminator) 124, either directly or after having traversed conditioning device 126, such as a beam expander 126, for example. Illuminator 124 can comprise an adjusting device 128 that sets the outer and/or inner radial extent (commonly referred to as σ-outer and σ-inner, respectively) of the intensity distribution in beam 122. In addition, illuminator 124 can include various other components, such as an integrator 130 and a condenser 132. In this way, beam 110 impinging on the array of individually controllable elements 104 has a desired uniformity and intensity distribution in its cross-section.

In one example, source 112 is within the housing of lithographic projection apparatus 100 (as is often the case when source 112 is a mercury lamp, for example). In another example, source 112 is remotely located with respect to lithographic projection apparatus 100. In this latter example, radiation beam 122 is directed into apparatus 100 (e.g., with the aid of suitable directing mirrors (not shown)). This latter scenario is often the case when source 112 is an excimer laser.

It is to be appreciated that both of these scenarios are contemplated within the scope of the present invention.

Beam 110 subsequently interacts with the array of individually controllable elements 104 after being directed using beam splitter 118. In the example shown, having been reflected by the array of individually controllable elements 104, beam 110 passes through projection system 108, which focuses beam 110 onto a target portion 120 of substrate 114.

With the aid of positioning device 116, and optionally interferometric measuring device 134 on a base plate 136 that receives interferometric beams 138 via beam splitter 140, substrate table 106 is moved accurately, so as to position different target portions 120 in a path of beam 110.

In one example, a positioning device (not shown) for the array of individually controllable elements 104 can be used to accurately correct the position of the array of individually controllable elements 104 with respect to the path of beam 110, e.g., during a scan.

In one example, movement of substrate table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 may alternatively/additionally be moveable, while substrate table 106 and/or the array of individually controllable elements 104 may have a fixed position to provide the required relative movement.

In another example, substrate table 106 may be fixed, with substrate 114 being moveable over substrate table 106. Where this is done, substrate table 106 is provided with a multitude of openings on a flat uppermost surface. A gas is fed through the openings to provide a gas cushion, which supports substrate 114. This is referred to as an air bearing arrangement. Substrate 114 is moved over substrate table 106 using one or more actuators (not shown), which accurately position substrate 114 with respect to the path of beam 110. In another example, substrate 114 is moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography, and for other applications.

The depicted apparatus 100 can be used in at least one of four modes:

1. Step mode: the entire pattern on the array of individually controllable elements 104 is projected during a single exposure (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 moves in a given direction (e.g., a "scan direction," for example, the y direction) with a speed v, so that patterned beam 110 is caused to scan over the array of individually controllable elements 104. Concurrently, substrate table 106 is simultaneously moved in the same or opposite direction at a speed $V=Mv$, in which M is the magnification of projection system 108. In this manner, a relatively large target portion 120 can be exposed, without having to compromise on resolution.

3. Pulse mode: the array of individually controllable elements 104 is kept essentially stationary, and the entire pattern is projected onto a target portion 120 of substrate 114 using pulsed radiation system 102. Substrate table 106 is moved with an essentially constant speed, such that patterned beam 110 scans a line across substrate 106. The pattern on the array of individually controllable elements 104 is updated as required between pulses of radiation system 102, and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

Exemplary Elements in the Array of Programmable Elements

Figure 2:
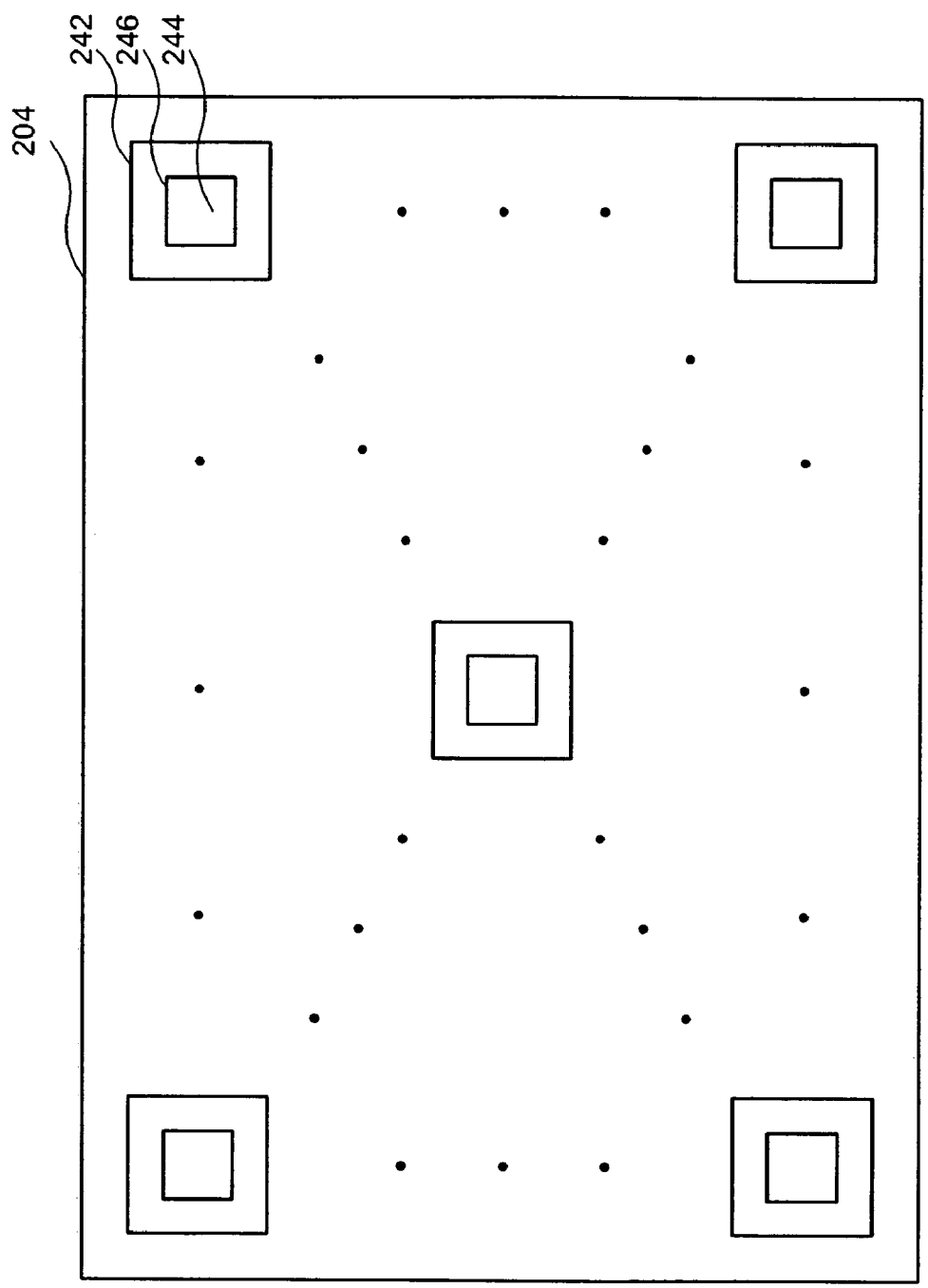
FIG. 2 depicts a patterning device, according to one embodiment of the invention.

FIG. 2 shows a top view of an array of individually controllable elements 204, according to one embodiment of the present invention. For example, array of individually controllable elements 204 can be used in place of array 104. Each element 242 in array of individually controllable elements 204 includes an active area 244 and an inactive area 246. Active areas 244 can be formed of mirrors, liquid crystal display elements, grating light valves, etc., discussed in more detail above, and are used to pattern incoming light, while inactive areas 246 include circuitry and mechanical devices and structures. The devices and structures in inactive areas 246 are used to control and/or move (e.g., tilt, piston, etc.) active areas 244 to turn active areas 244 ON and OFF, and in some examples, to move active areas 244 to and through various intermediate states.

Exemplary Pattern Data Generating System

Figure 3:
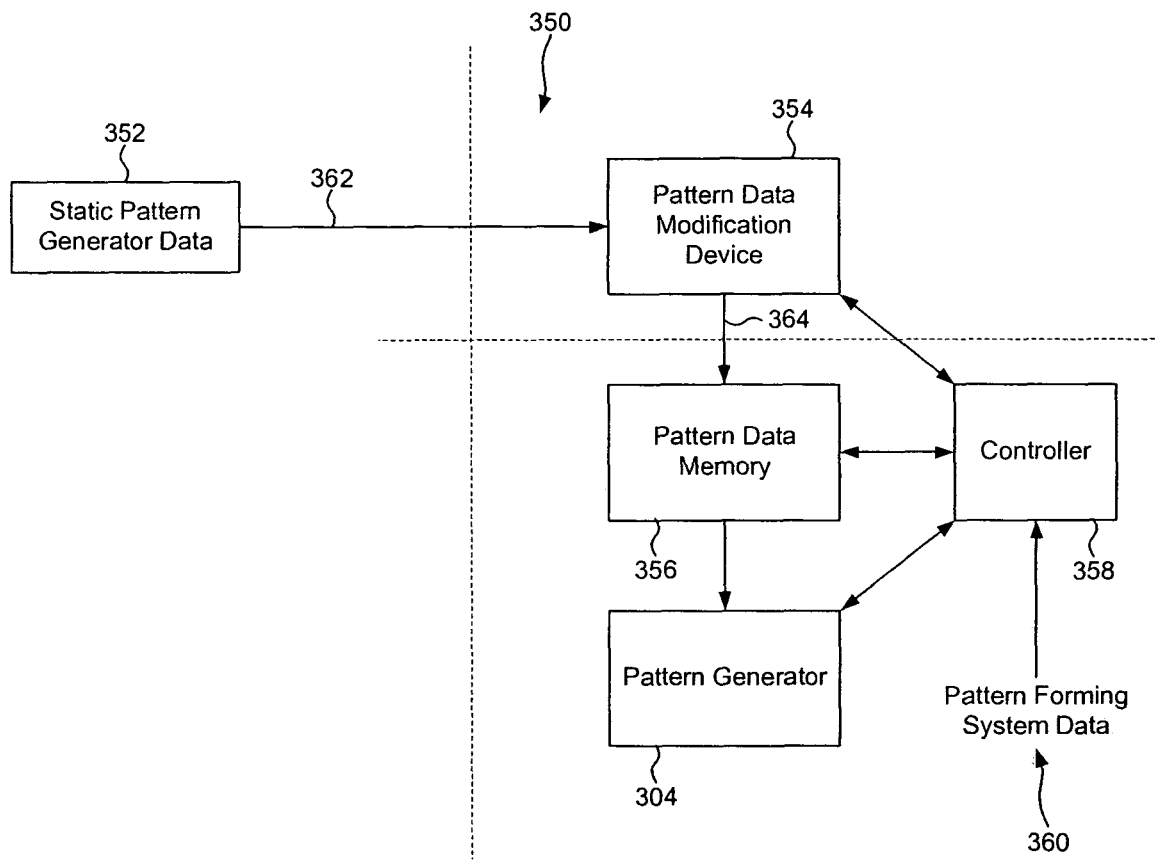
FIG. 3 depicts a pattern data generating system coupled to a pattern forming system, according to one embodiment of the present invention.

FIG. 3 depicts a pattern data generating system 350 coupled to a pattern forming system 360, according to one embodiment of the present invention. In various examples, pattern forming system 360 can be part of or include system 100, as discussed above. Pattern forming system 360 comprises a dynamic pattern generator or dynamic pattering device 304, which terms are used interchangeably throughout this description. In one example, pattern data generating system 350 includes static patterning device data device 352 and a pattern data modification device 354. In some instances, a pattern data memory 356 and a controller 358 can be included in pattern data generating system 350, while in other instances they are included in pattern forming system 360.

In one example, static patterning data device 352 includes software, firmware, hardware, or a combination thereof, which takes either manufacturing data used to form a pattern on a static patterning device or captures an image of a pattern formed on a static patterning device, i.e., with a detecting or sensing system (not shown), and computes pattern image data 362 therefrom. This can be done through carrying out of an algorithm. It is to be appreciated that other operations can be performed to initially generate the pattern data associated with the static patterning device.

In one example, pattern data modification device 354 comprises software, firmware, hardware, or a combination thereof. These can be used to carry out an algorithm. In one example, pattern data modification device 354 receives or accesses inputs relating to various factors. For example, these factors can be, but not limited to: (1) a hypothetical or fictitious pattern of a static patterning device; (2) constraints imposed on the static patterning device pattern due to manufacturing and/or exposure tolerances; (3) constraints imposed on a specific and/or type of dynamic pattern generator 304 that is receives pattern data 362; (4) actual performance characteristics of dynamic pattern generator 304, either measured continuously in real time or periodically; (5) a wavelength of light being used; (6) optical properties of a projection system used to project patterned light onto an object, for example a numerical aperture of the projection system; and/or (7) illumination mode (e.g., incoherent, coherent, partially coherent, spatial distribution of light, etc). Pattern data modification device 354 takes these inputs, along with static patterning device data 362 relating to the hypothetical or fictitious static patterning device, and generates modified pattern data 364. Modified pattern data 364 is stored before being used to control dynamic patterning device 304. For example, modified pattern data 364 controls states of pixels or individual controllable elements in dynamic patterning device 304.

In one example, when performance in "real time" is desired, exposures are performed in pulses. Between each pulse, pattern data 362 for a next fictitious static patterning device is received by pattern data modification device 354, possibly along with one or more of the additional factors described above. Pattern data modification device 354 then generates modified pattern data 364.

It is to be appreciated that the more rapidly pattern data modification device 354 can perform calculations, the more accurate pattern data 364 becomes because more calculations can be performed in between each pulse.

In one example, static patterning device data device 352 and pattern data modification device 354 are positioned physically proximate relative to each other, while in other examples they are positioned remotely from each other. In either example, pattern data associated with one or more static patterning devices is stored in static patterning device data device 352, which can be a memory or storage device, as would be appreciated by one or ordinary skill in the art upon reading this description. For example, when forming patterns having multiple layers on an object, each layer typically comes from one or more static patterning devices. Pattern data 362 associated with each static patterning device is transmitted from static patterning device data device 352 to pattern data modification device 354. Pattern data modification device 354 is used to modify static patterning device data 362 to form modified pattern data 364, which is stored in pattern data memory 356.

In one example, as discussed above, pattern data modification device 354 processes pattern data 362 to remove aspects of the data corresponding to constraints on static patterning devices. For example, this can be manufacturing constraints that effect patterns formed on static patterning devices or constraints imposed on these patterns due to exposure operation parameters. Data associated with these constraints is removed because these constraints are not relevant or necessary when the pattern data is being used in a dynamic patterning device environment.

In one example, as discussed above, pattern modification device 354 processes pattern data 362 to take into account actual optical parameters in pattern forming system 360 and/or dynamic patterning device 304. For example, actual performance of optical elements in pattern forming system 360 can be taken into account when modifying pattern data 362 to form modified pattern data 364. This can be done by measuring patterned light leaving the dynamic patterning device 304 and/or by measuring patterned light at an image plane.

In another example, characteristics related to an actual type of dynamic patterning device 304 being used (e.g., modulation properties) and/or characteristics related to a measured performance, possibly measured in real time, of dynamic patterning device 304 can be accounted for when modifying pattern data 362 to form modified data 364. An example measured performance of the dynamic patterning device 304 can be, but is not limited to, an actual tilt angle of individually controllable elements, or the like, which should be taken into account in pattern data 364. Another example measured performance can be related to the use of pistoning mirrors in dynamic pattern generator 304. A pistoning mirror typically has the ability to vary phase, but not reflectivity, so this can be taken into account by pattern modification device 354 when generating modified pattern data 364.

In one example, the pattern modification discussed above can be performed in real time, i.e., either continuously or between each exposure operation, so that each exposed pattern or pattern layer is accurately formed on an object. For example, pattern data 362 from a first static patterning device, or fictitious static patterning device that would have been used to pattern an object, is transmitted from static patterning device data device 352 to pattern data modification device 354 to be processed. Modified pattern data 364 is stored in pattern data memory 356. Modified pattern data 364 is accessed by dynamic patterning device 304 to form a pattern therefrom, which pattern is used to pattern a beam of radiation interacting with dynamic pattern generator 304. The patterned beam is then projected onto an object (not shown). This process is repeated for data related to each subsequent static patterning device that would have been used to pattern the object.

In other examples, data associated with an entire set of static patterning devices that would have been used to pattern the object is all modified and stored before an exposure operation.

In this latter example, when actual optical element and/or dynamic pattern generator characteristics are used to modify pattern data 362, they are used to modify data 362 only once, before the exposure operations begins. In contrast, in the former example, the actual optical element and/or dynamic pattern generator characteristics can be used to modify data for each static patterning device, between each exposure.

Thus, through the use of pattern data modification device 354, unnecessary constraints related to static patterning devices can be removed from pattern data 362 and characteristics of an actual type of dynamic pattern generator 304 being used can be accounted for in modified pattern data 364. This allows increased accuracy and effectiveness when patterning an object, as compared to conventional systems.

In one example, the modification of pattern data 362 is used to account for optical proximity correction (OPC) features, patterns, or enhancements. A binary nature of the OPC feature is mostly dictated by the static patterning device manufacturing constraints. The OPC features are not intended to appear in the developed image, but are used to affect the shape of the pattern features in the developed image, such that, when developed, the pattern features are closer to the desired pattern. OPC features may also be used to bring a process window of features of different pitches closer together to enable features of several different pitches to be printed in a single exposure. Known types of OPC features include scattering bars, serifs, hammerheads, and the like. To prevent the OPC features appearing in the developed pattern, they are made sub-resolution. For example, the OPC features are made to have a width less than a wavelength of exposure radiation in the case of scattering bars, so that the contrast in the projected image is less than a resist threshold. Use of these features is described, for example, in U.S. Ser. No. 10/919,532, filed Aug. 17, 2004, which is incorporated by reference herein in its entirety.

As discussed above, in some situations OPC features are used because a pattern on a static patterning device may not necessarily have a same shape as a pattern desired to be projected onto a image plane. For example, if an isolated line is desired to be printed, in order to have an optical image of this line, a static patterning device is created having a principle line and auxiliary lines (e.g., OPCs) that are very thin located to the left and right of the principle line. When imaged, this is printed as a single line. This is also true when corners are desired to be other than right angles, so OPCs are used to account for this.

In one example, using pattern data modification device 354, continuous OPC-enhanced patterns computed for rasterization can include a variation in local amplitude and phase transmittance that matches the modulation capabilities of dynamic pattern generator 304 being used in pattern forming system 360. For example, a continuous pattern that has only amplitude transmittance variation (graytone pattern) would match a dynamic pattern generator with graytoning pixels.

Similarly, a continuous pattern that has only phase transmittance variation (phase pattern) would match a dynamic pattern generator with pistoning mirror pixels. The graytone pattern would also match well with the performance of a dynamic pattern generator with sub-resolution tilting mirror pixels. In one example, for this type of a dynamic pattern generator, at least the two values of local phase transmittance (0 and pi) are included to account for a "negative black" effect.

In one example, a class of phase-amplitude transmittance functions are generated to match the performance of a dynamic pattern generator with tilting mirror pixels. Continuous OPC patterns are then generated for the class.

In one example, at every point the transmittance may need to be constrained according to a modulation capability of dynamic pattern generator 304.

In one example, another requirement to impose constraint is that it may not be practical to vary transmittance within known limits, but rather transmittance should be varied continuously.

In one example, it may be useful to allow only variation of transmittance within a pattern that consists of certain polygons, inside polygon transmittance is constant. Each polygon has a constant transmittance, but relative to other polygons transmittance may vary. If a hypothetical static pattering device is varies transmittance continuously, pattern data relating to the hypothetical static patterning device may contain an infinite amount of information. In one example, a transmittance of each polygon is specified, and a transmittance of the background, around and between each polygon, is specified, which reduces the amount of information characterizing the hypothetical static patterning device.

Similarly, it is to be appreciated that a generic "graytone" OPC pattern may contain an infinite amount of information. Thus, to maintain a reasonable data throughput rate, a limit of the possible variations of transmittance in the OPC pattern, e.g., using graytone and/or phase varying scatter bars instead of a generic continuous graytone/phase variation, can be used, for example.

Exemplary Computer System

Figure 4:
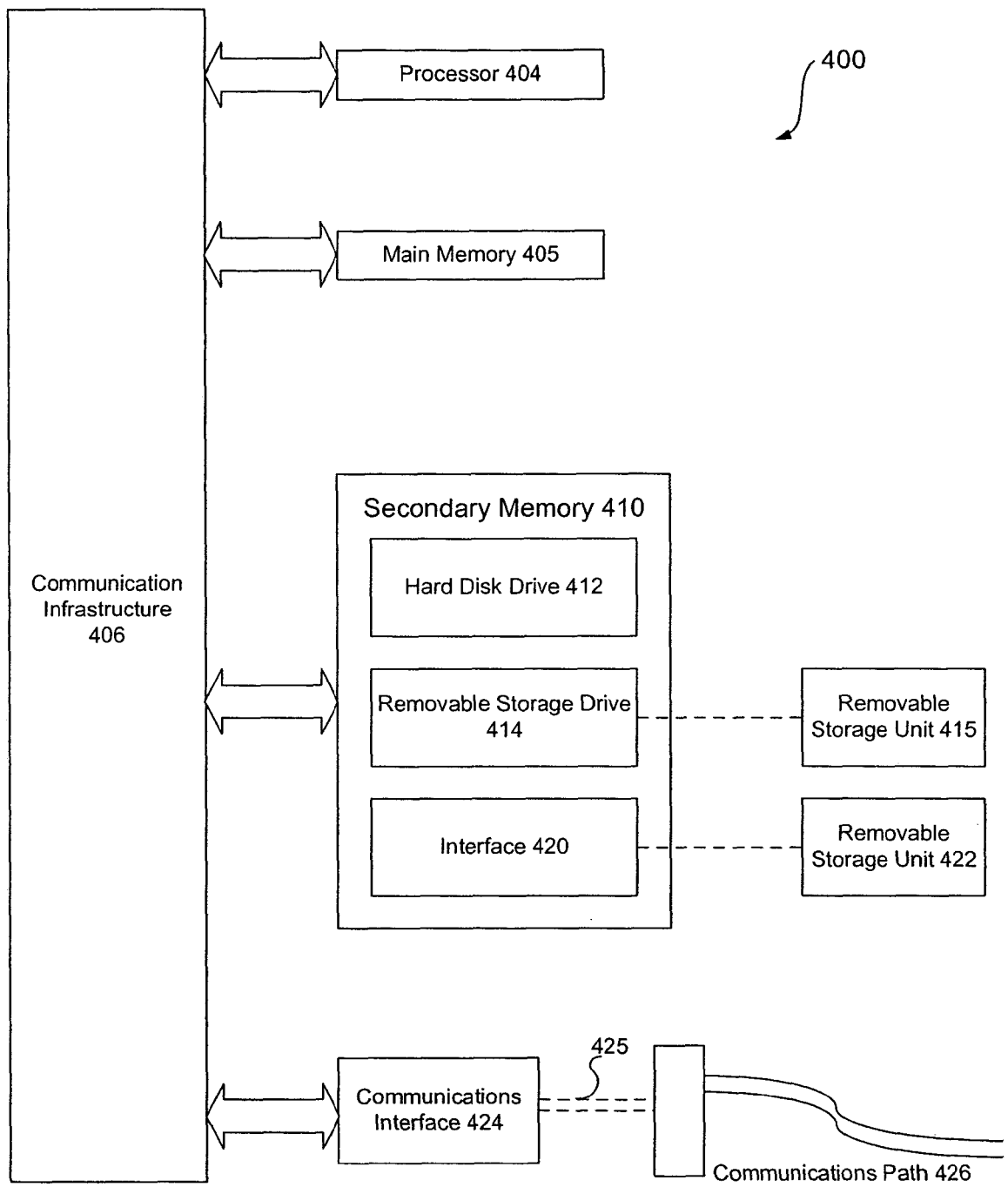
FIG. 4 shows an exemplary computer system, according to one embodiment of the present invention.

FIG. 4 illustrates an example computer system 400, in which the present invention, or portions thereof, can be implemented as computer-readable code. For example, one or more of the elements discussed above, for example, 350, 358, or 304, can be implemented in system 400. Various embodiments of the invention are described in terms of this example computer system 400. After reading this description, it will become apparent to a person skilled in the relevant art how to implement the invention using other computer systems and/or computer architectures.

The computer system 400 includes one or more processors, such as processor 404. Processor 404 can be a special purpose or a general purpose digital signal processor. The processor 404 is connected to a communication infrastructure 406 (for example, a bus or network). Various software implementations are described in terms of this exemplary computer system. After reading this description, it will become apparent to a person skilled in the relevant art how to implement the invention using other computer systems and/or computer architectures.

Computer system 400 also includes a main memory 408, preferably random access memory (RAM), and may also include a secondary memory 410. The secondary memory 410 may include, for example, a hard disk drive 412 and/or a removable storage drive 414, representing a floppy disk drive, a magnetic tape drive, an optical disk drive, etc. The removable storage drive 414 reads from and/or writes to a removable storage unit 418 in a well known manner. Removable storage unit 418, represents a floppy disk, magnetic tape, optical disk, etc. which is read by and written to by removable storage drive 414. As will be appreciated, the removable storage unit 418 includes a computer usable storage medium having stored therein computer software and/or data.

In alternative implementations, secondary memory 410 may include other similar means for allowing computer programs or other instructions to be loaded into computer system 400. Such means may include, for example, a removable storage unit 422 and an interface 420. Examples of such means may include a program cartridge and cartridge interface (such as that found in video game devices), a removable memory chip (such as an EPROM, or PROM) and associated socket, and other removable storage units 422 and interfaces 420 which allow software and data to be transferred from the removable storage unit 422 to computer system 400.

Computer system 400 may also include a communications interface 424. Communications interface 424 allows software and data to be transferred between computer system 800 and external devices. Examples of communications interface 424 may include a modem, a network interface (such as an Ethernet card), a communications port, a PCMCIA slot and card, etc. Software and data transferred via communications interface 424 are in the form of signals 428 which may be electronic, electromagnetic, optical, or other signals capable of being received by communications interface 424. These signals 428 are provided to communications interface 424 via a communications path 426. Communications path 426 carries signals 428 and may be implemented using wire or cable, fiber optics, a phone line, a cellular phone link, an RF link and other communications channels.

In this document, the terms "computer program medium" and "computer usable medium" are used to generally refer to media such as removable storage drive 414, a hard disk installed in hard disk drive 412, and signals 428. Computer program medium and computer usable medium can also refer to memories, such as main memory 408 and secondary memory 410, which can be memory semiconductors (e.g.

DRAMs, etc.) These computer program products are means for providing software to computer system 400.

Computer programs (also called computer control logic) are stored in main memory 408 and/or secondary memory 410. Computer programs may also be received via communications interface 424. Such computer programs, when executed, enable the computer system 400 to implement the present invention as discussed herein. In particular, the computer programs, when executed, enable the processor 404 to implement the processes of the present invention, such as operations in pattern data modification device 354, controller 358, etc. discussed above. Accordingly, such computer programs represent controlling systems of the computer system 400. Where the invention is implemented using software, the software may be stored in a computer program product and loaded into computer system 400 using removable storage drive 414, hard drive 412 or communications interface 424.

The invention is also directed to computer products comprising software stored on any computer useable medium. Such software, when executed in one or more data processing device, causes the data processing device(s) to operation as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nano-technological storage device, etc.), and communication mediums (e.g., wired and wireless communications networks, local area networks, wide area networks, intranets, etc.). It is to be appreciated that the embodiments described herein can be implemented using software, hardware, firmware, or combinations thereof.

Exemplary Operation

Figure 5:
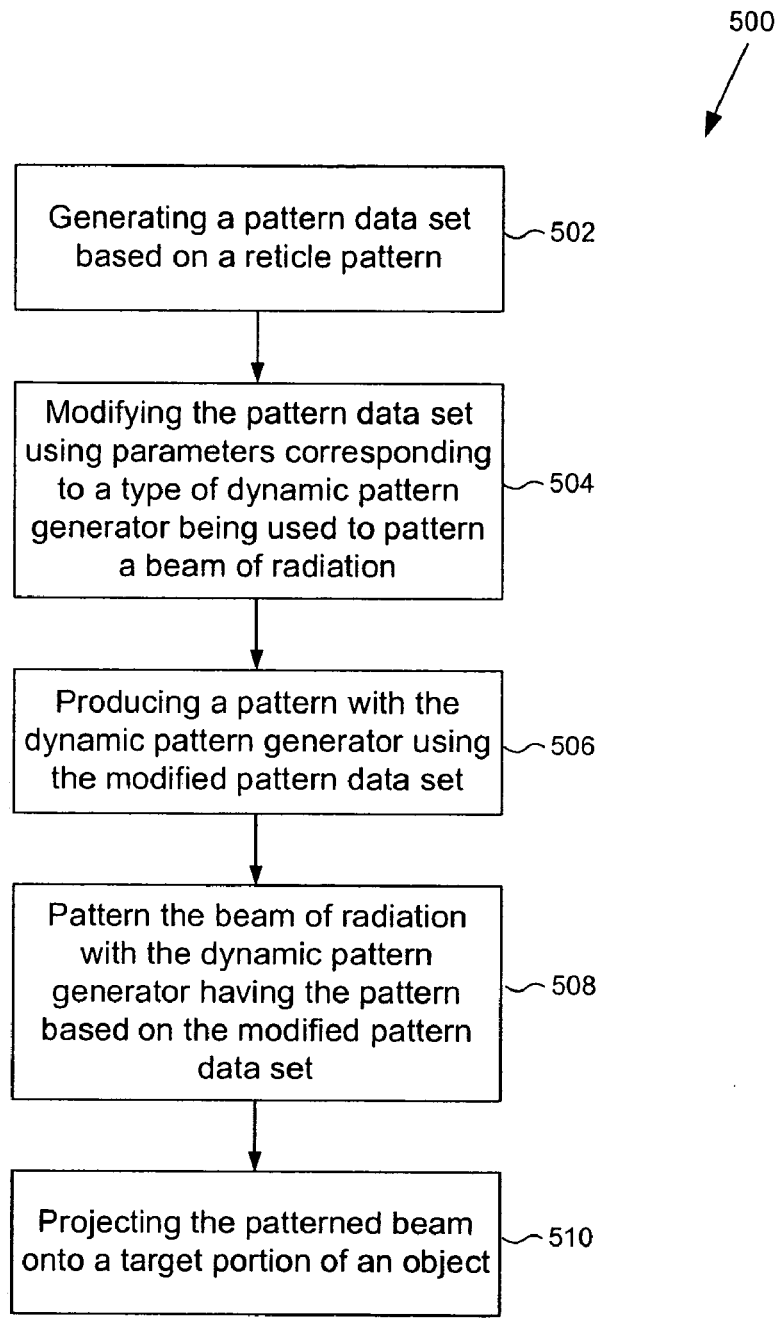
FIG. 5 shows a flow chart depicting a method, according to one embodiment of the present invention.

FIG. 5 shows a flow chart depicting a method 500, according to one embodiment of the present invention. In step 502, a pattern data set is generated based on a reticle pattern. In step 504, the pattern set is modified using parameters corresponding to a type of dynamic pattern generator being used to pattern a beam of radiation. In step 506, a pattern is produced with the dynamic pattern generator using the modified pattern data set. In step 508, the beam of radiation is patterned with the dynamic pattern generator having the pattern based on the modified pattern data set. In step 510, the patterned beam is projected onto a target portion of an object.

In one example, steps 502 to 510 are performed for each reticle pattern in a set of reticle patterns.

In one example, steps 502 to 510 are performed for optical proximity correction patterns in the reticle pattern.

In one example, step 502 includes using an optical rasterization algorithm to generate the pattern data.

In one example, step 504 includes taking in account an optical parameter (e.g., wavelength of the beam of radiation, numerical aperture of a system used to project the patterned beam, an illumination mode of a device used to generate the beam of radiation (e.g., coherent, incoherent, partially coherent, etc.), or the like) to further modify the pattern data.

In one example, steps 502, 504, and 506 are performed in real-time during a duration of each pulse or between each pulse of the beam of radiation for each reticle pattern in the set of reticle patterns.

Exemplary Patterning Using OPC

Figure 6:
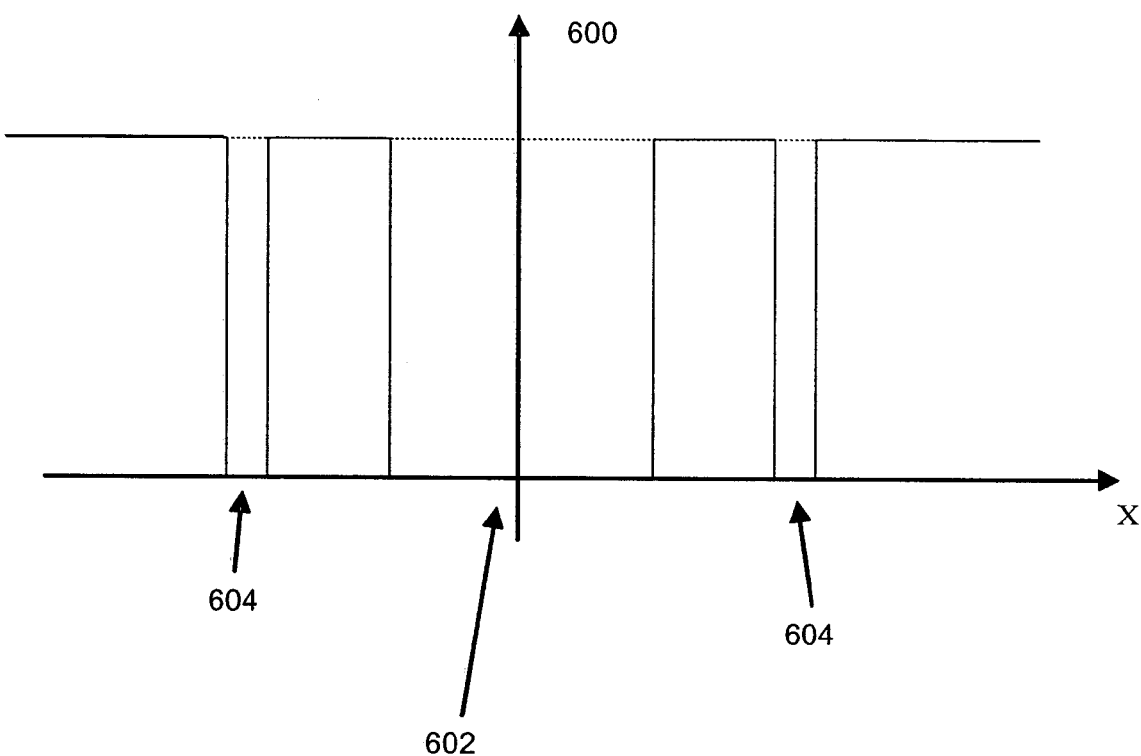
FIG. 6 shows a pattern including a principal pattern and OPC enhancements as would appear on a static patterning device.

FIG. 6 shows a pattern 600 including a principal pattern 602 and OPC enhancements 604 as would appear on a static patterning device 606. As dictated by the manufacturability constraints, principal pattern 602 (e.g. a line) and OPC enhancements 604 (e.g. scatterbars) have a limited variation of their optical properties. For example, pattern 600 has to be binary, or a combination of a binary pattern with the areas with a phase shift and a certain fixed value of amplitude attenuation.

Figure 7:
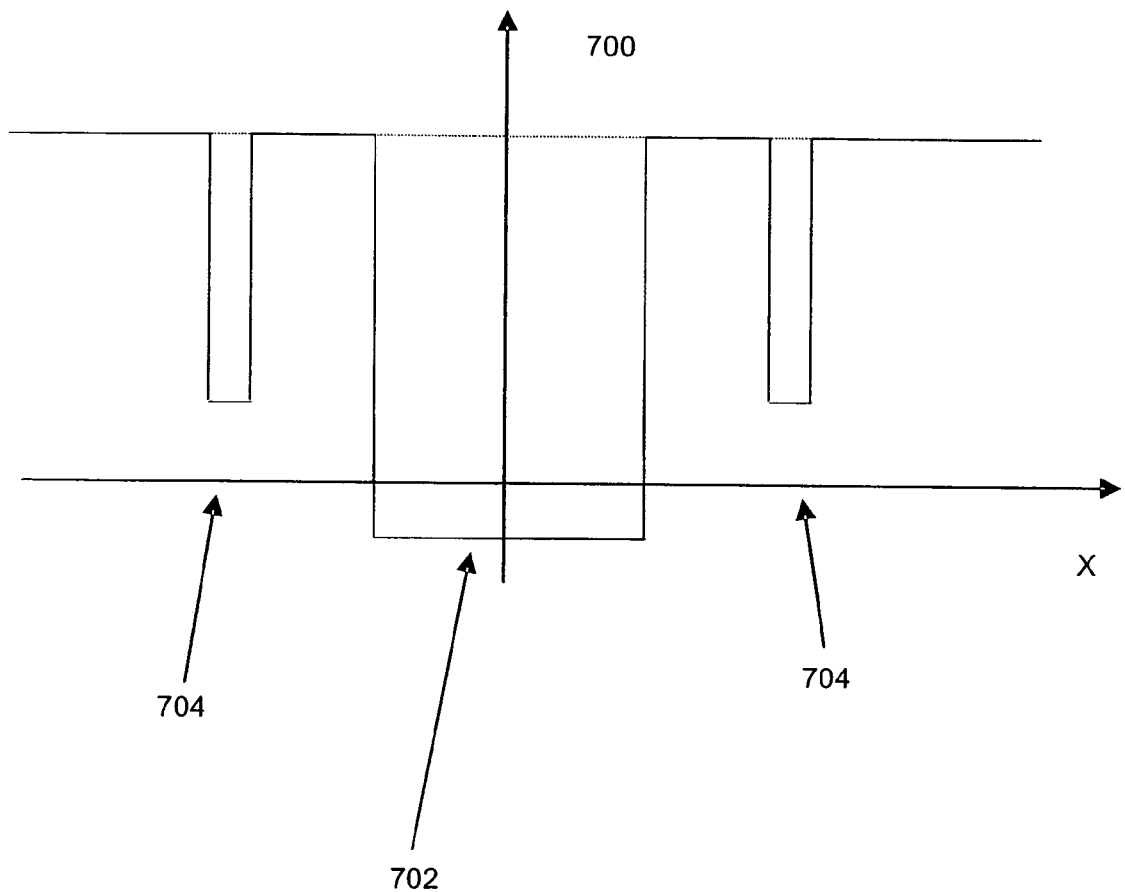
FIG. 7 shows a pattern including a principal pattern and OPC enhancements as would appear on a dynamic pattern device, according to one embodiment of the present invention.

FIG. 7 shows a pattern 700 including a principal pattern 702 and OPC enhancements 704 as would appear according to one or more embodiments of the present invention. In the absence of manufacturability constraints, both principal pattern 702 and OPC enhancements 704 may have a wider variation of their optical properties, e.g., an amplitude attenuation and a phase, and be more accurately patterned. The range of these variations is determined by the modulation capabilities of a particular dynamic pattern generator being used. For instance, the modulation capabilities of a tilting mirror SLM allows varying of amplitude transmittance within the range [min_amp, 1], where min_amp can be negative. In this example, principal pattern 702 can have negative darkness and OPC enhancements 704 can be gray toned, which may not be possible using pattern data from a static pattering device, as shown above with respect to FIG. 6.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that only the Detailed Description section is meant to be used in interpreting claim limitations, and the Summary and Abstract sections are not to be used when interpreting the claim limitations. The Summary and Abstract sections are merely one or more exemplary embodiments or/examples of the present invention, while the Detailed Description provides additional/alternative embodiments and/or examples.

What is claimed is:

1. A method, comprising:
   receiving a pattern data set;
   detecting a type of pattern generator being used to pattern a beam of radiation from a plurality of types of pattern generators;
   modifying the pattern data set using parameters corresponding to the detected type of pattern generator;
   producing a pattern with the pattern generator using the modified pattern data set;
   patterning the beam of radiation with the pattern generator having the pattern based on the producing; and
   projecting the patterned beam onto a target portion of an object.

2. The method of claim 1, further comprising:
   performing the detecting, modifying producing, patterning, and projecting for each reticle pattern in a set of reticle patterns being received.

3. The method of claim 1, further comprising:
   performing the receiving, detecting, modifying producing, patterning, and projecting for optical proximity correction patterns in the pattern data set.

4. The method of claim 1, wherein the receiving comprises using an optical rasterization algorithm to generate the received pattern data.

5. The method of claim 1, wherein of the producing comprises using one of tilting reflective devices, pistoning reflective devices, graytoning reflective devices, and light wall devices in the pattern generator.

6. The method of claim 5, wherein the producing comprises using one of a transmissive or reflective digital mirror device, a grating light valve, a liquid crystal display, and a liquid crystal on silicon (LCOS) device.

7. The method of claim 1, wherein the producing further comprises:
   modifying the pattern data with an optical parameter.

8. The method of claim 7, wherein the producing further comprises:
   using at least one of wavelength, numerical aperture, and illumination mode as the optical parameter.

9. The method of claim 7, wherein the illumination mode comprises:
   coherent, partially coherent, or incoherent light.

10. The method of claim 1, further comprising performing the receiving, detecting, modifying, and producing in real time during a duration of each pulse of the beam of radiation for each reticle pattern in a set of reticle patterns being used to generate the pattern data set based on the receiving.

11. The method of claim 1, further comprising performing the receiving, detecting, modifying, and producing in real time during a duration between each pulse of the beam of radiation for each reticle pattern in a set of reticle patterns being used to generate the pattern data set in based on the receiving.

12. The method of claim 1, further comprising:
   using a substrate as the object.

13. The method of claim 1, further comprising:
   using a projection system display device as the object.

14. The method of claim 1, further comprising:
   using a projection television system display device as the object.

15. The method of claim 1, wherein the receiving comprises using reticle pattern data as the received pattern data set.

16. The method of claim 1, wherein the modifying, producing and patterning utilize a dynamic patterning device as the patterning device.

* * * * *